United States Patent
Dai et al.

(10) Patent No.: US 10,261,426 B2
(45) Date of Patent: Apr. 16, 2019

(54) OPTIMIZATION METHOD AND SYSTEM FOR OVERLAY ERROR COMPENSATION

(71) Applicant: Shanghai Huali Microelectronics Corporation, Shanghai (CN)

(72) Inventors: Yunqing Dai, Shanghai (CN); Jian Wang, Shanghai (CN)

(73) Assignee: SHANGHAI HUALI MICROELECTRONICS CORPORATION, Shanghai (CN)

(*) Notice: Subject to any disclaimer, the term of this patent is extended or adjusted under 35 U.S.C. 154(b) by 8 days.

(21) Appl. No.: 15/800,071

(22) Filed: Nov. 1, 2017

(65) Prior Publication Data

US 2018/0275529 A1    Sep. 27, 2018

(30) Foreign Application Priority Data

Mar. 27, 2017   (CN) .......................... 2017 1 0187899

(51) Int. Cl.
*G03F 7/20* (2006.01)
*H01L 21/68* (2006.01)
*H01L 21/66* (2006.01)

(52) U.S. Cl.
CPC ...... *G03F 7/70633* (2013.01); *G03F 7/70625* (2013.01); *H01L 21/68* (2013.01); *H01L 22/12* (2013.01); *H01L 22/34* (2013.01)

(58) Field of Classification Search
CPC .................................................. G03F 7/70633
USPC ............................................................ 716/51
See application file for complete search history.

(56) References Cited

U.S. PATENT DOCUMENTS

| 2014/0272717 A1* | 9/2014 | Cheng | G03F 1/70 430/319 |
| 2015/0067617 A1* | 3/2015 | Chang | G06F 17/5081 716/52 |

* cited by examiner

*Primary Examiner* — Suresh Memula
(74) *Attorney, Agent, or Firm* — Tianchen LLC

(57) ABSTRACT

An optimization method for overlay error compensation is disclosed. The method comprises setting process parameters for each semiconductor layer of a semiconductor device corresponding to a run path formed by different lithographic apparatus which sequentially process target semiconductor layers from a first target layer to a latest target layer; measuring overlay errors between an actual and a theoretical exposed patterns of the first semiconductor layer; selecting a group of process parameters corresponding to the run path from the first target layer to the latest target layer aligned by the current semiconductor layer; after exposing the current semiconductor layer using the selected process parameters, measuring overlay errors between the current semiconductor layer and its target layer; and correcting the selected process parameters according to the overlay errors between the current semiconductor layer and its target layer, and the overlay errors between the actual and theoretical exposed patterns of the first semiconductor layer.

8 Claims, 5 Drawing Sheets

==Prior Art==

==Prior Art==

OPTIMIZATION METHOD AND SYSTEM FOR OVERLAY ERROR COMPENSATION

CROSS-REFERENCE TO RELAYED APPLICATION

This application claims the priority benefit of China application serial no. 201710187899.6, filed Mar. 27, 2017. All disclosure of the China application is incorporated herein by reference.

FIELD OF THE INVENTION

The present invention relates to the field of photolithography technology, and more particularly to an optimization method and system for overlay error compensation.

BACKGROUND OF THE INVENTION

Generally, advanced process control (APC) systems are adopted to compensate overlay errors for photolithographic apparatus. The APC system receives the measured overlay errors of a production lot of semiconductor devices and calculates overlay model parameters for the production lot.

However, current APC systems merely compensate the overlay error between the current layer and a previous layer, without considering the overlay error between the actual exposed pattern and the theoretical exposed pattern of the first layer. As shown in FIG. 1, as for the first layer of the semiconductor device, the actual patterns T1, T2 respectively exposed by two lithographic apparatus are both different from the theoretical exposed pattern (indicated by bold solid lines). As shown in FIG. 2, the actual patterns L1, L2 of two different lots of same product exposed by a same lithographic apparatus are both different from the theoretical exposed pattern (indicated by bold solid lines). Furthermore, when calculating overlay model parameters for a current layer of a current production lot, the APC system only considers the differences between the current tool and the pre-tool (the layer exposed by the pre-tool is a target layer to be aligned with by the current layer) used for the current production lot, while the difference of pre-pre-tools (the layer exposed by the pre-pre-tool is previous target layer to be aligned with by layer exposed by the pre-tool) for the two production lots are not differentiated. As a result, OOS (out of spec) problems of the overlay error between the subsequent layers may occur.

SUMMARY OF THE INVENTION

Accordingly, at least one objective of the present invention is to provide an optimization method and system for overlay error compensation, which can prevent OOC problems of overlay accuracy, decrease process rework rate, and reduce overlay residue.

To achieve these and other advantages and in accordance with the objective of the invention, as embodied and broadly described herein, the invention provides an optimization method for overlay error compensation comprising the following steps:

S01: for each lithographic apparatus, setting multiple groups of process parameters for each semiconductor layer of a semiconductor device; wherein each group of process parameters for a semiconductor layer corresponds to a run path formed by different lithographic apparatus which sequentially process target semiconductor layers from a first target semiconductor layer to a latest target semiconductor layer, wherein the latest target semiconductor is aligned by the semiconductor layer;

S02: after one of the lithographic apparatus exposing a first semiconductor layer of the semiconductor device of a production lot, measuring and collecting overlay errors between an actual exposed pattern of the first semiconductor layer and a theoretical exposed pattern of the first semiconductor layer;

S03: before a lithographic apparatus exposing a current semiconductor layer of the semiconductor device of a current production lot, selecting a group of process parameters corresponding to the run path of target semiconductor layers from the first target semiconductor layer to the latest target semiconductor layer aligned the current semiconductor layer;

S04, after the lithographic apparatus exposing the current semiconductor layer of the semiconductor device of the current production lot using the selected group of process parameters, measuring overlay errors between the current semiconductor layer and the latest target semiconductor layer aligned by the current semiconductor layer;

S05, correcting the group of process parameters selected in step S03 according to the overlay errors between the current semiconductor layer and the latest target semiconductor layer aligned by the current semiconductor layer of the semiconductor device and the overlay errors between the actual exposed pattern of the first semiconductor layer and theoretical exposed pattern of the first semiconductor layer, so as to obtain an updated group of process parameters for the current semiconductor layer corresponding to the run path of target semiconductor layers from the first target semiconductor layer to the latest target semiconductor layer aligned by the current semiconductor layer.

Preferably, each of the group of process parameters, and the overlay errors between the current semiconductor layer and the latest target semiconductor layer aligned by the current semiconductor layer is represented by ten parameters including an X-translation, a Y-translation, a substrate expansion along the X-axis, a substrate expansion along the Y-axis, a substrate rotation, a substrate orthogonality, a field magnification, an asymmetrical magnification, a field rotation, and a field asymmetrical rotation; the overlay errors between the actual exposed pattern of the first semiconductor layer and theoretical exposed pattern of the first semiconductor layer is represented by four parameters including a field magnification, an asymmetrical magnification, a field rotation, and a field asymmetrical rotation.

Preferably, step S05 further comprises: converting each parameter of the group of the process parameters into a series of high-order non-linear values through a high-order non-linear mathematical model, then converting the overlay errors between the current semiconductor layer and the latest target semiconductor layer aligned by the current semiconductor layer of the semiconductor device, and the overlay errors between the exposed pattern of the first semiconductor layer and theoretical exposed pattern into a series of high-order non-linear offset values; calculating the series of high-order non-linear values and the series of high-order non-linear offset values to obtain each parameter of an updated group of process parameters for the current semiconductor layer corresponding to the run path of semiconductor layers from the first target semiconductor layer to the latest target semiconductor layer aligned by the current semiconductor layer, which is represented by a series of calculated high-order non-linear values.

Preferably, each parameter of the ten parameters is converted by the high-order non-linear mathematical model as follows:

$$T_x(x, y) = T_x00 + T_x10*x + T_x01*y + T_x20*x^2 + T_x11*xy + T_x02*y^2 + T_x30*x^3 + \ldots + \ldots;$$

$$T_y(x, y) = T_y00 + T_y10*x + T_y01*y + T_y20*x^2 + T_y11*xy + T_y02*y^2 + T_y30*x^3 + \ldots + \ldots;$$

$$S_x(x, y) = S_x00 + S_x10*x + S_x01*y + S_x20*x^2 + S_x11*xy + S_x02*y^2 + S_x30*x^3 + \ldots + \ldots;$$

$$S_y(x, y) = S_y00 + S_y10*x + S_y01*y + S_y20*x^2 + S_y11*xy + S_y02*y^2 + S_y30*x^3 + \ldots + \ldots;$$

$$Rot(x, y) = R00 + R10*x + R01*y + R20*x^2 + R11*xy + R02*y^2 + R30*x^3 + \ldots + \ldots;$$

$$Orth(x, y) = O00 + O10*x + O01*y + O20*x^2 + O11*xy + O02*y^2 + O30*x^3 + \ldots + \ldots;$$

$$Rmag(x, y) = R_m00 + R_m10*x + R_m01*y + R_m20*x^2 + R_m11*xy + R_m02*y^2 + R_m30*x^3 + \ldots + \ldots;$$

$$ARmag(x, y) = AR_m00 + AR_m10*x + AR_m01*y + AR_m20*x^2 + AR_m11*xy + AR_m02*y^2 + AR_m30*x^3 + \ldots + \ldots;$$

$$Rrot(x, y) = R_r00 + R_r10*x + R_r01*y + R_r20*x^2 + R_r11*xy + R_r02*y^2 + R_r30*x^3 + \ldots + \ldots;$$

$$ARrot(x, y) = AR_r00 + AR_r10*x + AR_r01*y + AR_r20*x^2 + AR_r11*xy + AR_r02*y^2 + AR_r30*x^3 + \ldots + \ldots;$$

wherein, $T_x(x, y)$ and $T_y(x, y)$ are the X-translation and Y-translation; $S_x(x, y)$, $S_y(x, y)$ are the substrate expansions along the X-axis and the Y-axis; $Rot(x, y)$ is the substrate rotation; $Orth(x, y)$ is the substrate orthogonality, $Rmag(x, y)$ is the field magnification; $ARmag(x, y)$ is the asymmetrical magnification; $Rrot(x, y)$ is the field rotation, and $ARrot(x, y)$ is the field asymmetrical rotation; wherein $T_x00$, $T_x10$, $T_x20$ ..., $T_x01$, $T_x02$ ..., $T_y00$, $T_y10$, $T_y20$ ..., $T_y01$, $T_y02$ ..., $S_x00$, $S_x10$, $S_x20$ ..., $S_x01$, $S_x02$ ..., $S_y00$, $S_y10$, $S_y20$ ..., $S_y01$, $S_y02$ ..., $R00$, $R10$, $R20$ ..., $R01$, $R02$ ..., $O00$, $O10$, $O20$ ..., $O01$, $O02$ ..., $R_m00$, $R_m10$, $R_m20$ ..., $R_m01$, $R_m02$ ..., $AR_m00$, $AR_m10$, $AR_m20$ ..., $AR_m01$, $AR_m02$ ..., $R_r00$, $R_r10$, $R_r20$ ..., $R_r01$, $R_r02$ ..., $AR_r00$, $AR_r10$, $AR_r20$ ..., $AR_r01$, $AR_r02$ ... are coefficients.

To achieve the above objectives, the invention also provides an optimization system for overlay error compensation. The optimization system comprises multiple lithographic apparatus, a metrology system, and an APC system.

The metrology system is configured to measure overlay errors between an actual exposed pattern of the first semiconductor layer and a theoretical exposed pattern of the first semiconductor layer after a lithographic apparatus exposing a first semiconductor layer of the semiconductor device of a production lot, and measure overlay errors between a current semiconductor layer of the semiconductor device of a current production lot and a latest target semiconductor layer aligned by the current semiconductor layer of the semiconductor device of the current production lot after the lithographic apparatus exposing the current semiconductor layer.

The APC system is configured to:

set multiple groups of process parameters for each semiconductor layer of the semiconductor device for each lithographic apparatus, wherein each group of process parameters for a semiconductor layer corresponds to a run path formed by different lithographic apparatus which sequentially process from target semiconductor layers from a first semiconductor layer to a latest target semiconductor layer aligned by the semiconductor layer;

select a group of process parameters corresponding to the run path of the target semiconductor layers from the first target semiconductor layer to the latest target semiconductor layer aligned by the current semiconductor layer before a lithographic apparatus exposing the current semiconductor layer of the semiconductor device of the current production lot; and correct the selected group of process parameters according to the overlay errors between the current semiconductor layer and the latest target semiconductor layer aligned by the current semiconductor layer, and the overlay errors between the actual exposed pattern of the first semiconductor layer and theoretical exposed pattern of the first semiconductor layer corresponding to the current production lot, so as to obtain an updated group of process parameters for the current semiconductor layer corresponding to the run path of target semiconductor layers from the first target semiconductor layer to the latest target semiconductor layer aligned by the current semiconductor layer.

Preferably, each of the group of process parameters, and the overlay errors between the current semiconductor layer and the latest target semiconductor layer aligned by the current semiconductor layer is represented by ten parameters including an X-translation, a Y-translation, a substrate expansion along the X-axis, a substrate expansion along the Y-axis, a substrate rotation, a substrate orthogonality, a field magnification, an asymmetrical magnification, a field rotation, and a field asymmetrical rotation; the overlay errors between the actual exposed pattern of the first semiconductor layer and theoretical exposed pattern of the first semiconductor layer is represented by four parameters including a field magnification, an asymmetrical magnification, a field rotation, and a field asymmetrical rotation.

Preferably, the APC system converts each parameter of the group of the process parameters into a series of high-order non-linear values through a high-order non-linear mathematical model, converts the overlay errors between the current semiconductor layer and the latest target semiconductor layer aligned by the current semiconductor layer of the semiconductor device and the overlay errors between the exposed pattern of the first semiconductor layer and theoretical exposed pattern into a series of high-order non-linear offset values, and calculates the series of high-order non-linear values and the series of high-order non-linear offset values to obtain each parameter of an updated group of process parameters for the current semiconductor layer corresponding to the run path of target semiconductor layers from the first target semiconductor layer to the latest target semiconductor layer aligned by the current semiconductor layer, which is represented by a series of calculated high-order non-linear values.

Preferably, each parameter of the ten parameters is converted by the high-order non-linear mathematical model as follows:

$$T_x(x, y) = T_x00 + T_x10*x + T_x01*y + T_x20*x^2 + T_x11*xy + T_x02*y^2 + T_x30*x^3 + \ldots + \ldots;$$

$$T_y(x, y) = T_y00 + T_y10*x + T_y01*y + T_y20*x^2 + T_y11*xy + T_y02*y^2 + T_y30*x^3 + \ldots + \ldots;$$

$$S_x(x, y) = S_x00 + S_x10*x + S_x01*y + S_x20*x^2 + S_x11*xy + S_x02*y^2 + S_x30*x^3 + \ldots + \ldots;$$

$$S_y(x, y) = S_y00 + S_y10*x + S_y01*y + S_y20*x^2 + S_y11*xy + S_y02*y^2 + S_y30*x^3 + \ldots + \ldots;$$

$$Rot(x, y) = R00 + R10^*x + R01^*y + R20^*x^2 + R11^*xy + R02^*y^2 + R30^*x^3 + \ldots + \ldots ;$$

$$Orth(x, y) = O00 + O10^*x + O01^*y + O20^*x^2 + O11^*xy + O02^*y^2 + O30^*x^3 + \ldots + \ldots ;$$

$$Rmag(x, y) = R_m00 + R_m10^*x + R_m01^*y + R_m20^*x^2 + R_m11^*xy + R_m02^*y^2 + R_m30^*x^3 + \ldots + \ldots ;$$

$$ARmag(x, y) = AR_m00 + AR_m10^*x + AR_m01^*y + AR_m20^*x^2 + AR_m11^*xy + AR_m02^*y^2 + AR_m30^*x^3 + \ldots + \ldots ;$$

$$Rrot(x, y) = R_r00 + R_r10^*x + R_r01^*y + R_r20^*x^2 + R_r11^*xy + R_r02^*y^2 + R_r30^*x^3 + \ldots + \ldots ;$$

$$ARrot(x, y) = AR_r00 + AR_r10^*x + AR_r01^*y + AR_r20^*x^2 + AR_r11^*xy + AR_r02^*y^2 + AR_r30^*x^3 + \ldots + \ldots ;$$

wherein, $T_x(x, y)$ and $T_y(x, y)$ are the X-translation and Y-translation; $S_x(x, y)$, $S_y(x, y)$ are the substrate expansions along the X-axis and the Y-axis; $Rot(x, y)$ is the substrate rotation; $Orth(x, y)$ is the substrate orthogonality, $Rmag(x, y)$ is the field magnification; $ARmag(x, y)$ is the asymmetrical magnification; $Rrot(x, y)$ is the field rotation, and $ARrot(x, y)$ is the field asymmetrical rotation; wherein $T_x00, T_x10, T_x20 \ldots, T_x01, T_x02 \ldots, T_y00, T_y10, T_y20 \ldots, T_y01, T_y02 \ldots, S_x00, S_x10, S_x20 \ldots, S_x01, S_x02 \ldots, S_y00, S_y10, S_y20 \ldots, S_y01, S_y02 \ldots, R00, R10, R20 \ldots, R01, R02 \ldots, O00, O10, O20 \ldots, O01, O02 \ldots, R_m00, R_m10, R_m20 \ldots, R_m01, R_m02 \ldots, AR_m00, AR_m10, AR_m20 \ldots, AR_m01, AR_m02 \ldots, R_r00, R_r10, R_r20 \ldots, R_r01, R_r02 \ldots, AR_r00, AR_r10, AR_r20 \ldots, AR_r01, AR_r02 \ldots$ are coefficients.

As is disclosed above, according to the optimization method and system for overlay error compensation of the present invention, the 1$^{st}$ layer within-shot (WIS) overlay errors are considered in the overlay error correction to improve the overlay performance between the tool to tool matching and lot to lot matching during the lithographic process for the subsequent production lots, which reduces the overlay OOS rate and the process rework rate. Furthermore, the present invention also differentiates various run paths associated with lithographic apparatus and target semiconductor layers for multiple production lots, sets different groups of process parameters corresponding to different run paths, which further decreases the overlay OOS rate and the process rework rate. In addition, since the compensation to the overlay errors is performed to the process parameters, the 1$^{st}$ layer within shot overlay error and the overlay errors between the current semiconductor and the target semiconductor layer aligned by the current semiconductor layer through high-order non-linear expansion, the overlay residue (which cannot be compensated) can be minimized.

BRIEF DESCRIPTION OF THE DRAWINGS

The optimization method and system for overlay error compensation of the present invention will be elucidated by reference to the following embodiments and the accompanying drawings, in which.

DETAILED DESCRIPTION OF THE EMBODIMENTS

The invention will be described in further details hereinafter with respect to the embodiments and the accompanying drawings of FIGS. 3-13.

Figure 1:
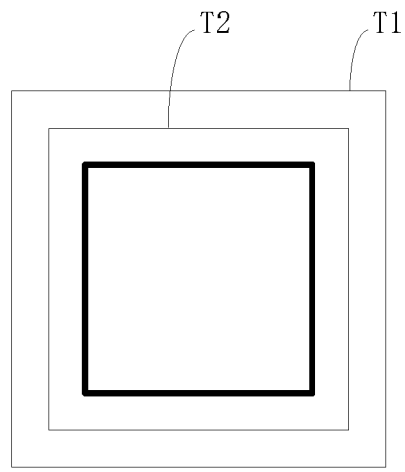
FIG. 1 is a diagram showing differences between the actual exposed pattern respectively exposed by two lithographic apparatus and the theoretical exposed pattern.
Figure 2:
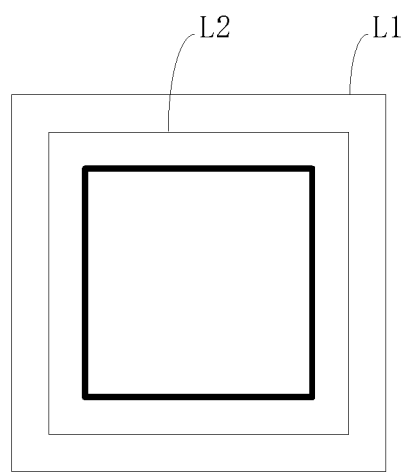
FIG. 2 is a diagram showing differences between the actual exposed pattern of two different production lots exposed by a single lithographic apparatus and the theoretical exposed pattern.
Figure 3:
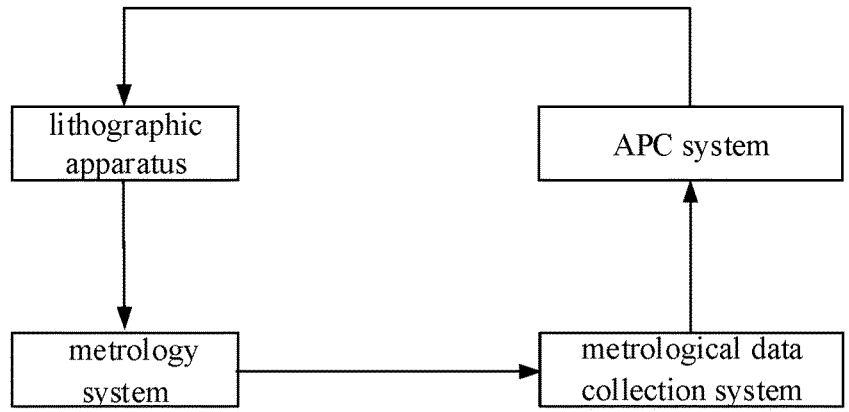
FIG. 3 is a diagram showing the optimization system for overlay error compensation according to an embodiment of the present invention.

Referring to FIG. 1, an optimization system for overlay error compensation is shown. The optimization system for overlay error compensation may include multiple lithographic apparatus. Each lithographic apparatus may be a stepper or scanner-type lithographic apparatus configured to process one or more semiconductor layers on a substrate to generate a semiconductor device.

The optimization system may further include a metrology system and a metrological data collection system. The metrology system is configured to perform semiconductor layer overlay error measurements. The metrological data collection system is configured to collect the overlay error values.

The optimization system may further include an APC system. The APC system is configured to automatically adjust the process parameters to compensate the overlay errors.

Figure 4:
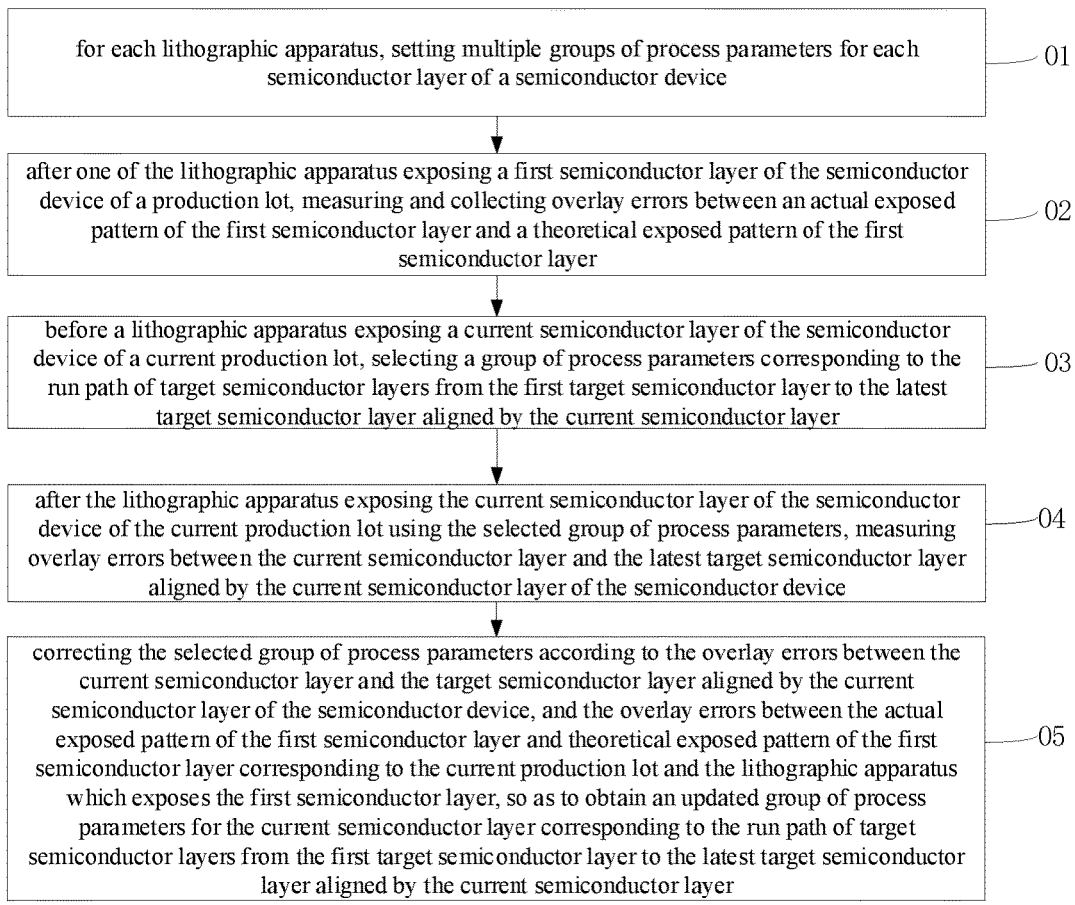
FIG. 4 is a flow chart showing the optimization method for overlay error compensation according to an embodiment of the present invention.
Figure 5:
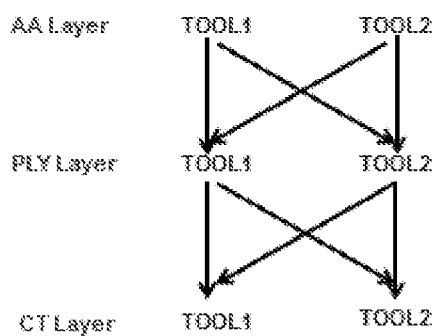
FIG. 5 is a diagram showing different run paths formed by two lithographic apparatus which sequentially process the first target semiconductor layer to the third target semiconductor layer.
Figure 6:
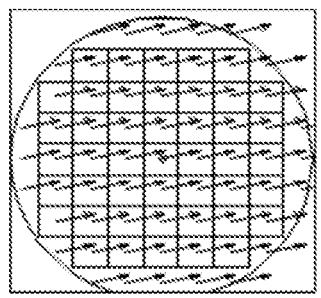
FIG. 6 is a diagram showing the X-translation and the Y-translation of the overlay error.
Figure 7:
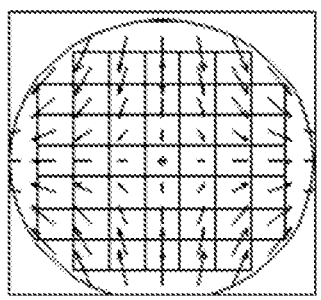
FIG. 7 is a diagram showing the substrate expansion along the X-axis and the substrate expansion along the Y-axis of the overlay error.
Figure 8:
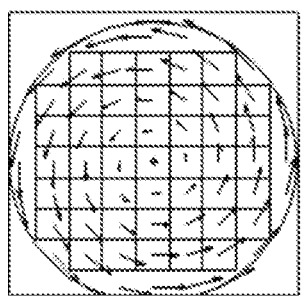
FIG. 8 is a diagram showing the substrate rotation of the overlay error.
Figure 9:
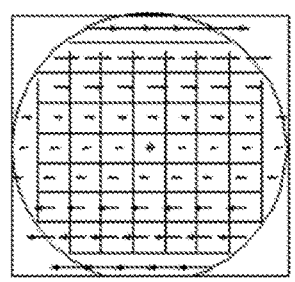
FIG. 9 is a diagram showing the substrate orthogonality of the overlay error.
Figure 10:
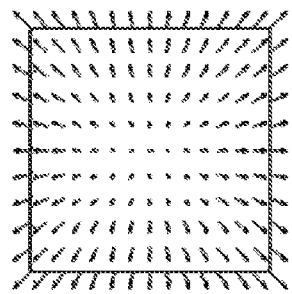
FIG. 10 is a diagram showing the field magnification of the overlay error.
Figure 11:
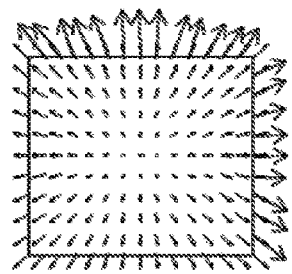
FIG. 11 is a diagram showing the asymmetrical magnification of the overlay error.
Figure 12:
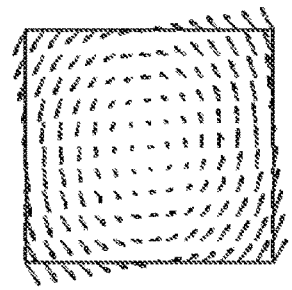
FIG. 12 is a diagram showing the field rotation of the overlay error.
Figure 13:
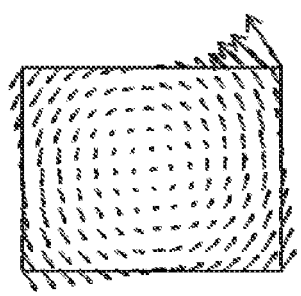
FIG. 13 is a diagram showing the field asymmetrical rotation of the overlay error.

Please referring to FIG. 4, the optimization method for overlay error compensation comprises the following steps:

S01: for each lithographic apparatus, setting multiple groups of process parameters for each semiconductor layer of a semiconductor device.

In this step, the APC system sets multiple groups of process parameters corresponding to each semiconductor layer and each lithographic apparatus. That is, for each lithographic apparatus, multiple groups of process parameters can be provided by the APC system when it performs the lithographic process to a semiconductor layer. Herein, each group of process parameters for a current semiconductor layer corresponds to a run path formed by different lithographic apparatus which sequentially process target semiconductor layers from a first target semiconductor layer to a latest target semiconductor layer. Herein, the term "target semiconductor layer" refers to a semiconductor layer to be aligned with during the lithographic process, "the latest target layer" refers to a semiconductor to be aligned with by the current semiconductor layer. For example, please refer to FIG. 5, the optimization system comprises two lithographic apparatus TOOL1 and TOOL2, the semiconductor device has three target semiconductor layers of active area layer (AA layer), polysilicon layer (POLY layer), contact layer (CT layer). Other semiconductor layers may also be formed between theses target semiconductor layers. To process the semiconductor layers from the AA layer to the CT layer, eight different run paths can be provided by these two lithographic apparatus. Therefore, with respect to each lithographic apparatus, the APC system sets eight groups of process parameters corresponding to eight run paths for the CT layer and other non-target semiconductor layers to be formed after the fabrication of the CT layer. Similarly, if there exists a fourth target semiconductor layer of the semiconductor device, then for each lithographic apparatus, the APC system sets sixteen groups of process parameters for the fourth target semiconductor layer and other non-target semiconductor layers to be formed after the fabrication of the fourth target semiconductor layer.

Please referring to FIG. 6-FIG. 13, in the embodiment, each group of initial process parameter comprises ten parameters as follows: (1) a X-translation; (2) a Y-translation 111a; (3) a substrate expansion along the X-axis; (4) a substrate expansion along the Y-axis; (5) a substrate rotation; (6) a substrate orthogonality; (7) a field magnification; (8) an asymmetrical magnification; (9) a field rotation; (10) a field asymmetrical rotation.

S02: after one of the lithographic apparatus exposing a first semiconductor layer of the semiconductor device of a production lot, measuring and collecting overlay errors between an actual exposed pattern of the first semiconductor layer and a theoretical exposed pattern of the first semiconductor layer.

In this step, for each lithographic apparatus, after it exposes a first semiconductor layer of the semiconductor device of a production lot, the metrology system measures the overlay errors between an actual exposed pattern of the first semiconductor layer and a theoretical exposed pattern of the first semiconductor layer, that is, the $1^{st}$ semiconductor layer within-shot (WIS) overlay error. The metrological data collection system collects the $1^{st}$ semiconductor layer WIS overlay error values corresponding to different production lots and different lithographic apparatus. For example, if there provides two lithographic apparatus TOOL1 and TOOL2 and three production lots, then the metrological data collection system collects three $1^{st}$ semiconductor layer WIS overlay error values corresponding to three production lots for each of the lithographic apparatus.

In the embodiment, the $1^{st}$ semiconductor layer WIS overlay error comprises four parameters as follows: a field magnification; an asymmetrical magnification; a field rotation; a field asymmetrical rotation.

S03: before a lithographic apparatus exposing a current semiconductor layer of the semiconductor device of a current production lot, selecting a group of process parameters corresponding to the run path of target semiconductor layers from the first target semiconductor layer to the latest target semiconductor layer aligned by the current semiconductor layer.

In this step, the APC system selects an appropriate group of process parameters corresponding to the run path. For example, if the lithographic apparatus TOOL1 is to expose the CT layer of a semiconductor device of a first production lot, and the AA layer and the POLY layer are sequentially processed by the lithographic tools TOOL1 and TOOL2, then the APC system selects a group of process parameters corresponding to the run path of AA layer (TOOL1)-POLY layer (TOOL 2)-CT layer (TOOL 1)

S04, after the lithographic apparatus exposing the current semiconductor layer of the semiconductor device of the current production lot using the selected group of process parameters, measuring overlay errors between the current semiconductor layer and the latest target semiconductor layer aligned by the current semiconductor layer of the semiconductor device.

In this step, the metrology system measures the overlay errors between the current semiconductor layer and the latest target semiconductor layer. The metrological data collection system collects the overlay error values. For example, after the lithographic apparatus TOOL1 exposes the CT layer of the semiconductor device of the first production lot, the metrology system measures the overlay errors between the CT layer and POLY layer, and the metrological data collection system collects the overlay error values.

In the embodiment, the overlay errors between the current semiconductor layer and the latest target semiconductor layer aligned by the current semiconductor layer are also represented by ten parameters including the following: (1) a X-translation; (2) a Y-translation 111a; (3) a substrate expansion along the X-axis; (4) a substrate expansion along the Y-axis; (5) a substrate rotation; (6) a substrate orthogonality; (7) a field magnification; (8) an asymmetrical magnification; (9) a field rotation; (10) a field asymmetrical rotation.

S05, correcting the group of process parameters selected in step S03 according to the overlay errors between the current semiconductor layer and the target semiconductor layer aligned by the current semiconductor layer of the semiconductor device, and the overlay errors between the actual exposed pattern of the first semiconductor layer and theoretical exposed pattern of the first semiconductor layer corresponding to the current production lot and the lithographic apparatus which exposes the first semiconductor layer, so as to obtain an updated group of process parameters for the current semiconductor layer corresponding to the run path of target semiconductor layers from the first target semiconductor layer to the latest target semiconductor layer aligned by the current semiconductor layer.

In this step, the APC system corrects the selected group of process parameters according to the overlay errors between the current semiconductor layer and the latest target semiconductor layer aligned by the current semiconductor layer of the semiconductor device, and the $1^{st}$ layer WIS overlay error corresponding to the current production lot and the lithographic apparatus which exposes the first semiconductor layer, so as to obtain an updated group of process parameters for the current semiconductor layer corresponding to the run path.

Preferably, the APC system converts, through a high-order non-linear mathematical model, each parameter of the group of the process parameters into a series of high-order non-linear values, then converts the overlay errors between the current semiconductor layer and the latest target semiconductor layer, and the overlay errors between the exposed pattern of the first semiconductor layer and theoretical exposed pattern into a series of high-order non-linear offset values. After that, the APC system calculates the series of high-order non-linear values and the series of high-order non-linear offset values to obtain each parameter of an updated group of process parameters for the current semiconductor layer corresponding to the run path associated with target semiconductor layers from the first target semiconductor layer to the latest target semiconductor layer aligned by the current semiconductor layer, which is represented by a series of calculated high-order non-linear values.

Preferably, each parameter of the ten parameters is converted by the high-order non-linear mathematical model as follows:

$$T_x(x, y)=T_x00+T_x10*x+T_x01*y+T_x20*x^2+T_x11*xy+T_x02*y^2+T_x30*x^3+\ldots+\ldots;$$

$$T_y(x, y)=T_y00+T_y10*x+T_y01*y+T_y20*x^2+T_y11*xy+T_y02*y^2+T_y30*x^3+\ldots+\ldots;$$

$$S_x(x, y)=S_x00+S_x10*x+S_x01*y+S_x20*x^2+S_x11*xy+S_x02*y^2+S_x30*x^3+\ldots+\ldots;$$

$$S_y(x, y)=S_y00+S_y10*x+S_y01*y+S_y20*x^2+S_y11*xy+S_y02*y^2+S_y30*x^3+\ldots+\ldots;$$

$$Rot(x, y)=R00+R10*x+R01*y+R20*x^2+R11*xy+R02*y^2+R30*x^3+\ldots+\ldots;$$

$$Orth(x, y)=O00+O10*x+O01*y+O20*x^2+O11*xy+O02*y^2+O30*x^3+\ldots+\ldots;$$

$$Rmag(x, y)=R_m00+R_m10*x+R_m01*y+R_m20*x^2+R_m11*xy+R_m02*y^2+R_m30*x^3+\ldots+\ldots;$$

$$ARmag(x, y)=AR_m00+AR_m10*x+AR_m01*y+AR_m20*x^2+AR_m11*xy+AR_m02*y^2+AR_m30*x^3+\ldots+\ldots;$$

$$Rrot(x, y)=R_r00+R_r10*x+R_r01*y+R_r20*x^2+R_r11*xy+R_r02*y^2+R_r30*x^3+\ldots+\ldots;$$

$$ARrot(x, y)=AR_r00+AR_r10*x+AR_r01*y+AR_r20*x^2+AR_r11*xy+AR_r02*y^2+AR_r30*x^3+\ldots+\ldots;$$

wherein, $T_x(x, y)$ and $T_y(x, y)$ are the X-translation and Y-translation; $S_x(x, y)$, $S_y(x, y)$ are the substrate expansions along the X-axis and the Y-axis; $Rot(x, y)$ is the substrate rotation; $Orth(x, y)$ is the substrate orthogonality, $Rmag(x, y)$ is the field magnification; $ARmag(x, y)$ is the asymmetrical magnification; $Rrot(x, y)$ is the field rotation, and $ARrot(x, y)$ is the field asymmetrical rotation; wherein $T_x00$, $T_x10$, $T_x20 \ldots$, $T_x01$, $T_x02 \ldots$, $T_y00$, $T_y10$, $T_y20 \ldots$, $T_y01$, $T_y02 \ldots$, $S_x00$, $S_x10$, $S_x20 \ldots$, $S_x01$, $S_x02 \ldots$, $S_y00$, $S_y10$, $S_y20 \ldots$, $S_y01$, $S_y02 \ldots$, R00, R10, R20 $\ldots$, R01, R02 $\ldots$, O00, O10, O20 $\ldots$, O01, O02 $\ldots$, $R_m00$, $R_m10$, $R_m20 \ldots$, $R_m01$, $R_m02 \ldots$, $AR_m00$, $AR_m10$, $AR_m20 \ldots$, $AR_m01$, $AR_m02 \ldots$, $R_r00$, $R_r10$, $R_r20 \ldots$, $R_r01$, $R_r02 \ldots$, $AR_r00$, $AR_r10$, $AR_r20 \ldots$, $AR_r01$, $AR_r02 \ldots$ are coefficients.

For example, the APC system corrects the group of process parameters for the CT layer corresponding to the run path of AA layer (TOOL1)-POLY layer (TOOL 2)-CT layer (TOOL 1) for the first production lot according to the overlay errors between the CT layer and the POLY layer, and the 1' layer WIS overlay error corresponding to the first production lot and TOOL1. Then when a second production lot enters into the same lithographic apparatus TOOL1 with the same run path to expose the CT layer, the APC system will select the corrected group of process parameters for the lithographic apparatus TOOL1, and the lithographic apparatus TOOL1 will perform the lithographic processing to the CT layer using the corrected group of process parameters.

From above, according to the present invention, when correcting the overlay errors, the 1st layer within-shot (WIS) overlay errors are considered, which feedbacks the differences between tool to tool or lot to lot to the lithographic process for the subsequent production lots, which reduces the overlay OOS rate and the process rework rate. Furthermore, the present invention also differentiates various run paths associated with lithographic apparatus and target semiconductor layers for multiple production lots, sets different groups of process parameters corresponding to different run paths, which further decreases the overlay OOS rate and the process rework rate. In addition, since the overlay errors are compensated through high-order non-linear expansion to the parameters, the overlay residue (which cannot be compensated) can be minimized, the overlay error can be reduced to below 5 nm, which is of great importance to the overlay control in sub-45 nm manufacturing process.

Although the present invention has been disclosed as above with respect to the preferred embodiments, they should not be construed as limitations to the present invention. Various modifications and variations can be made by the ordinary skilled in the art without departing the spirit and scope of the present invention. Therefore, the protection scope of the present invention should be defined by the appended claims.

The invention claimed is:

1. An optimization method for overlay error compensation comprising:

S01: for each lithographic apparatus, setting multiple groups of process parameters for each semiconductor layer of a semiconductor device; wherein each group of process parameters for a semiconductor layer corresponds to a run path formed by different lithographic apparatus which sequentially process target semiconductor layers from a first target semiconductor layer to a latest target semiconductor layer, wherein the latest target semiconductor is aligned by the semiconductor layer;

S02: after one of the lithographic apparatus exposing a first semiconductor layer of the semiconductor device of a production lot, measuring and collecting overlay errors between an actual exposed pattern of the first semiconductor layer and a theoretical exposed pattern of the first semiconductor layer;

S03: before a lithographic apparatus exposing a current semiconductor layer of the semiconductor device of a current production lot, selecting a group of process parameters corresponding to the run path of target semiconductor layers from the first target semiconductor layer to the latest target semiconductor layer aligned the current semiconductor layer;

S04, after the lithographic apparatus exposing the current semiconductor layer of the semiconductor device of the current production lot using the selected group of process parameters, measuring overlay errors between the current semiconductor layer and the latest target semiconductor layer aligned by the current semiconductor layer;

S05, correcting the group of process parameters selected in step S03 according to the overlay errors between the current semiconductor layer and the latest target semiconductor layer aligned by the current semiconductor layer of the semiconductor device and the overlay errors between the actual exposed pattern of the first semiconductor layer and theoretical exposed pattern of the first semiconductor layer, so as to obtain an updated group of process parameters for the current semiconductor layer corresponding to the run path of target semiconductor layers from the first target semiconductor layer to the latest target semiconductor layer aligned by the current semiconductor layer.

2. The optimization method according to claim 1, wherein, each of the group of process parameters, and the overlay errors between the current semiconductor layer and the latest target semiconductor layer aligned by the current semiconductor layer is represented by ten parameters including an X-translation, a Y-translation, a substrate expansion along the X-axis, a substrate expansion along the Y-axis, a substrate rotation, a substrate orthogonality, a field magnification, an asymmetrical magnification, a field rotation, and a field asymmetrical rotation; the overlay errors between the actual exposed pattern of the first semiconductor layer and theoretical exposed pattern of the first semiconductor layer is represented by four parameters including a field magnification, an asymmetrical magnification, a field rotation, and a field asymmetrical rotation.

3. The optimization method according to claim 2, wherein, step S05 further comprises: converting each parameter of the group of the process parameters into a series of high-order non-linear values through a high-order non-linear mathematical model, then converting the overlay errors between the current semiconductor layer and the latest target semiconductor layer aligned by the current semiconductor layer of the semiconductor device, and the overlay errors between the exposed pattern of the first semiconductor layer and theoretical exposed pattern into a series of high-order non-linear offset values; calculating the series of high-order non-linear values and the series of high-order non-linear offset values to obtain each parameter of an updated group of process parameters for the current semiconductor layer corresponding to the run path of target semiconductor layers from the first target semiconductor layer to the latest target semiconductor layer aligned by the current semiconductor layer, which is represented by a series of calculated high-order non-linear values.

4. The optimization method according to claim 3, wherein, each parameter of the ten parameters is converted by the high-order non-linear mathematical model as follows:

$$T_x(x, y) = T_x00 + T_x10*x + T_x01*y + T_x20*x^2 + T_x11*xy + T_x02*y^2 + T_x30*x^3 + \ldots + \ldots;$$

$$T_y(x, y) = T_y00 + T_y10*x + T_y01*y + T_y20*x^2 + T_y11*xy + T_y02*y^2 + T_y30*x^3 + \ldots + \ldots;$$

$$S_x(x, y) = S_x00 + S_x10*x + S_x01*y + S_x20*x^2 + S_x11*xy + S_x02*y^2 + S_x30*x^3 + \ldots + \ldots;$$

$$S_y(x, y) = S_y00 + S_y10*x + S_y01*y + S_y20*x^2 + S_y11*xy + S_y02*y^2 + S_y30*x^3 + \ldots + \ldots;$$

$$Rot(x, y) = R00 + R10*x + R01*y + R20*x^2 + R11*xy + R02*y^2 + R30*x^3 + \ldots + \ldots;$$

$$Orth(x, y) = O00 + O10*x + O01*y + O20*x^2 + O11*xy + O02*y^2 + O30*x^3 + \ldots + \ldots;$$

$$Rmag(x, y) = R_m00 + R_m10*x + R_m01*y + R_m20*x^2 + R_m11*xy + R_m02*y^2 + R_m30*x^3 + \ldots + \ldots;$$

$$ARmag(x, y) = AR_m00 + AR_m10*x + AR_m01*y + AR_m20*x^2 + AR_m11*xy + AR_m02*y^2 + AR_m30*x^3 + \ldots + \ldots;$$

$$Rrot(x, y) = R_r00 + R_r10*x + R_r01*y + R_r20*x^2 + R_r11*xy + R_r02*y^2 + R_r30*x^3 + \ldots + \ldots;$$

$$ARrot(x, y) = AR_r00 + AR_r10*x + AR_r01*y + AR_r20*x^2 + AR_r11*xy + AR_r02*y^2 + AR_r30*x^3 + \ldots + \ldots;$$

wherein, $T_x(x, y)$ and $T_y(x, y)$ are the X-translation and Y-translation; $S_x(x, y)$, $S_y(x, y)$ are the substrate expansions along the X-axis and the Y-axis; $Rot(x, y)$ is the substrate rotation; $Orth(x, y)$ is the substrate orthogonality, $Rmag(x, y)$ is the field magnification; $ARmag(x, y)$ is the asymmetrical magnification; $Rrot(x, y)$ is the field rotation, and $ARrot(x, y)$ is the field asymmetrical rotation; wherein $T_x00$, $T_x10$, $T_x20$ ..., $T_x01$, $T_x02$ ..., $T_y00$, $T_y10$, $T_y20$ ..., $T_y01$, $T_y02$ ..., $S_x00$, $S_x10$, $S_x20$ ..., $S_x01$, $S_x02$ ..., $S_y00$, $S_y10$, $S_y20$ ..., $S_y01$, $S_y02$ ..., R00, R10, R20 ..., R01, R02 ..., O00, O10, O20 ..., O01, O02 ..., $R_m00$, $R_m10$, $R_m20$ ..., $R_m01$, $R_m02$ ..., $AR_m00$, $AR_m10$, $AR_m20$ ..., $AR_m01$, $AR_m02$ ..., $R_r00$, $R_r10$, $R_r20$ ..., $R_r01$, $R_r02$ ..., $AR_r00$, $AR_r10$, $AR_r20$ ..., $AR_r01$, $AR_r02$ ... are coefficients.

5. An optimization system for overlay error compensation comprising:
multiple lithographic apparatus;
a metrology system configured to measure overlay errors between an actual exposed pattern of the first semiconductor layer and a theoretical exposed pattern of the first semiconductor layer after one of the lithographic apparatus exposing a first semiconductor layer of the semiconductor device of a production lot; and measure overlay errors between a current semiconductor layer of the semiconductor device of a current production lot and a latest target semiconductor layer aligned by the current semiconductor layer of the semiconductor device of the current production lot after the lithographic apparatus exposing the current semiconductor layer;
an APC system configured to:
set multiple groups of process parameters for each semiconductor layer of the semiconductor device for each lithographic apparatus, wherein each group of process parameters for a semiconductor layer corresponds to a run path formed by different lithographic apparatus which sequentially process target semiconductor layers from the first target semiconductor layer to a target semiconductor layer aligned by the semiconductor layer;
select a group of process parameters corresponding to the run path of the target semiconductor layers from the first target semiconductor layer to the latest target semiconductor layer aligned by the current semiconductor layer before a lithographic apparatus exposing the current semiconductor layer of the semiconductor device of the current production lot; and
correct the selected group of process parameters according to the overlay errors between the current semiconductor layer and the latest target semiconductor layer aligned by the current semiconductor layer, and the overlay errors between the actual exposed pattern of the first semiconductor layer and theoretical exposed pattern of the first semiconductor layer corresponding to the current production lot, so as to obtain an updated group of process parameters for the current semiconductor layer corresponding to the run path of target semiconductor layers from the first target semiconductor layer to the latest target semiconductor layer aligned by the current semiconductor layer.

6. The optimization system according to claim 5, wherein, each of the group of process parameters, and the overlay errors between the current semiconductor layer and the latest target semiconductor layer aligned by the current semiconductor layer is represented by ten parameters including an X-translation, a Y-translation, a substrate expansion along the X-axis, a substrate expansion along the Y-axis, a substrate rotation, a substrate orthogonality, a field magnification, an asymmetrical magnification, a field rotation, and a field asymmetrical rotation; the overlay errors between the actual exposed pattern of the first semiconductor layer and theoretical exposed pattern of the first semiconductor layer is represented by four parameters including a field magnification, an asymmetrical magnification, a field rotation, and a field asymmetrical rotation.

7. The optimization system according to claim 6, wherein, the APC system converts each parameter of the group of the process parameters into a series of high-order non-linear values through a high-order non-linear mathematical model, converts the overlay errors between the current semiconductor layer and the latest target semiconductor layer aligned by the current semiconductor layer of the semiconductor device and the overlay errors between the exposed pattern of the first semiconductor layer and theoretical exposed pattern into a series of high-order non-linear offset values, and calculates the series of high-order non-linear values and the series of high-order non-linear offset values to obtain each parameter of an updated group of process parameters for the current semiconductor layer corresponding to the run path of target semiconductor layers from the first target semiconductor layer to the latest target semiconductor layer aligned by the current semiconductor layer, which is represented by a series of calculated high-order non-linear values.

8. The optimization system according to claim 7, wherein, each parameter of the ten parameters is converted by the high-order non-linear mathematical model as follows:

$$T_x(x, y) = T_x00 + T_x10*x + T_x01*y + T_x20*x^2 + T_x11*xy + T_x02*y^2 + T_x30*x^3 + \ldots + \ldots ;$$

$$T_y(x, y) = T_y00 + T_y10*x + T_y01*y + T_y20*x^2 + T_y11*xy + T_y02*y^2 + T_y30*x^3 + \ldots + \ldots ;$$

$$S_x(x, y) = S_x00 + S_x10*x + S_x01*y + S_x20*x^2 + S_x11*xy + S_x02*y^2 + S_x30*x^3 + \ldots + \ldots ;$$

$$S_y(x, y) = S_y00 + S_y10*x + S_y01*y + S_y20*x^2 + S_y11*xy + S_y02*y^2 + S_y30*x^3 + \ldots + \ldots ;$$

$$Rot(x, y) = R00 + R10*x + R01*y + R20*x^2 + R11*xy + R02*y^2 + R30*x^3 + \ldots + \ldots ;$$

$$Orth(x, y) = O00 + O10*x + O01*y + O20*x^2 + O11*xy + O02*y^2 + O30*x^3 + \ldots + \ldots ;$$

$$Rmag(x, y) = R_m00 + R_m10*x + R_m01*y + R_m20*x^2 + R_m11*xy + R_m02*y^2 + R_m30*x^3 + \ldots + \ldots ;$$

$$ARmag(x, y) = AR_m00 + AR_m10*x + AR_m01*y + AR_m20*x^2 + AR_m11*xy + AR_m02*y^2 + AR_m30*x^3 + \ldots + \ldots ;$$

$$Rrot(x, y) = R_r00 + R_r10*x + R_r01*y + R_r20*x^2 + R_r11*xy + R_r02*y^2 + R_r30*x^3 + \ldots + \ldots ;$$

$$ARrot(x, y) = AR_r00 + AR_r10*x + AR_r01*y + AR_r20*x^2 + AR_r11*xy + AR_r02*y^2 + AR_r30*x^3 + \ldots + \ldots ;$$

wherein, $T_x(x, y)$ and $T_y(x, y)$ are the X-translation and Y-translation; $S_x(x, y)$, $S_y(x, y)$ are the substrate expansions along the X-axis and the Y-axis; $Rot(x, y)$ is the substrate rotation; $Orth(x, y)$ is the substrate orthogonality, $Rmag(x, y)$ is the field magnification; $ARmag(x, y)$ is the asymmetrical magnification; $Rrot(x, y)$ is the field rotation, and $ARrot(x, y)$ is the field asymmetrical rotation; wherein $T_x00$, $T_x10$, $T_x20$ . . . , $T_x01$, $T_x02$ . . . , $T_y00$, $T_y10$, $T_y20$ . . . , $T_y01$, $T_y02$ . . . , $S_x00$, $S_x10$, $S_x20$ . . . , $S_x01$, $S_x02$ . . . , $S_y00$, $S_y10$, $S_y20$ . . . , $S_y01$, $S_y02$ . . . , R00, R10, R20 . . . , R01, R02 . . . , O00, O10, O20 . . . , O01, O02 . . . , $R_m00$, $R_m10$, $R_m20$ . . . , $R_m01$, $R_m02$ . . . , $AR_m00$, $AR_m10$, $AR_m20$ . . . , $AR_m01$, $AR_m02$ . . . , $R_r00$, $R_r10$, $R_r20$ . . . , $R_r01$, $R_r02$ . . . , $AR_r00$, $AR_r10$, $AR_r20$ . . . , $AR_r01$, $AR_r02$ . . . are coefficients.

* * * * *